United States Patent
Kim et al.

(10) Patent No.: US 10,748,481 B2
(45) Date of Patent: Aug. 18, 2020

(54) GATE DRIVER AND DISPLAY DEVICE INCLUDING THE SAME

(71) Applicant: LG DISPLAY CO., LTD., Seoul (KR)

(72) Inventors: Joonki Kim, Paju-si (KR); Kyuhan Yoon, Paju-si (KR); Sangjin Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 14 days.

(21) Appl. No.: 16/117,766

(22) Filed: Aug. 30, 2018

(65) Prior Publication Data

US 2019/0066582 A1 Feb. 28, 2019

(30) Foreign Application Priority Data

Aug. 30, 2017 (KR) .................. 10-2017-0110221

(51) Int. Cl.
*G09G 3/3233* (2016.01)
*G09G 3/3266* (2016.01)
*H01L 27/32* (2006.01)

(52) U.S. Cl.
CPC ......... *G09G 3/3233* (2013.01); *G09G 3/3266* (2013.01); *H01L 27/3276* (2013.01); *G09G 2300/0861* (2013.01); *G09G 2310/0251* (2013.01); *G09G 2310/0262* (2013.01); *G09G 2310/0286* (2013.01); *G09G 2310/08* (2013.01)

(58) Field of Classification Search
CPC .................. G09G 3/3266; G09G 2310/0286
See application file for complete search history.

(56) References Cited

U.S. PATENT DOCUMENTS

| 10,217,414 | B2* | 2/2019 | Park | G09G 3/3258 |
| 2012/0188290 | A1* | 7/2012 | Park | G09G 3/3266 345/690 |
| 2014/0055444 | A1* | 2/2014 | Jang | G09G 3/3291 345/213 |
| 2015/0348646 | A1* | 12/2015 | Wang | G11C 19/287 377/79 |
| 2017/0047009 | A1* | 2/2017 | Lee | G09G 3/3258 |
| 2017/0249905 | A1* | 8/2017 | Kim | G09G 3/3233 |
| 2017/0301295 | A1* | 10/2017 | Park | G09G 3/3258 |
| 2017/0345366 | A1* | 11/2017 | Jang | G09G 3/3674 |
| 2017/0365211 | A1* | 12/2017 | Lee | G09G 3/3233 |
| 2018/0068635 | A1* | 3/2018 | Zhu | G09G 5/006 |
| 2018/0144688 | A1* | 5/2018 | Lee | G09G 3/3225 |
| 2018/0151241 | A1* | 5/2018 | Qing | G11C 19/28 |
| 2018/0211716 | A1* | 7/2018 | Ma | G09G 3/20 |

(Continued)

*Primary Examiner* — Patrick F Marinelli
(74) *Attorney, Agent, or Firm* — Birch, Stewart, Kolasch & Birch, LLP

(57) ABSTRACT

A gate driver and a display device including the same are discussed. The gate driver includes a plurality of stages. Each stage includes a transistor T1 configured to apply a start signal to a node Q, a transistor Tu configured to output an emission signal of a gate low voltage to a node Na depending on a voltage of the node Q, a transistor T5 configured to control a voltage of a node QB to be reversed to the voltage of the node Q, a transistor Td configured to output the emission signal of a gate high voltage higher than the gate low voltage to the node Na depending on the voltage of the node QB, and a transistor Tbv connected between the transistor T1 and the node Q and configured to stabilize the voltage of the node Q.

18 Claims, 14 Drawing Sheets

(56) References Cited

U.S. PATENT DOCUMENTS

| | | | |
|---|---|---|---|
| 2018/0226133 A1* | 8/2018 | Feng | G09G 3/20 |
| 2018/0374410 A1* | 12/2018 | Zhu | G09G 3/20 |
| 2019/0066582 A1* | 2/2019 | Kim | G09G 3/3233 |
| 2019/0066604 A1* | 2/2019 | Kong | G09G 3/3291 |

* cited by examiner

GATE DRIVER AND DISPLAY DEVICE INCLUDING THE SAME

This application claims the priority benefit of Korea Patent Application No. 10-2017-0110221 filed on Aug. 30, 2017 in the Republic of Korea, which is incorporated herein by reference for all purposes as if fully set forth herein.

BACKGROUND OF THE INVENTION

Field of the Invention

The present disclosure relates to a gate driver and a display device including the same.

Discussion of the Related Art

An electroluminescent display is classified into an inorganic electroluminescent display and an organic electroluminescent display depending on a material of an emission layer. An active matrix organic light emitting diode (OLED) display includes a plurality of OLEDs capable of emitting light by themselves and has many advantages of fast response time, high emission efficiency, high luminance, wide viewing angle, and the like.

An OLED display includes pixels arranged in a matrix and adjusts a luminance of the pixels in accordance with gray levels of image data. Each pixel includes an OLED, a driving thin film transistor (TFT) controlling a driving current flowing in the OLED depending on a gate-to-source voltage of the driving TFT, and switching TFTs programming the gate-to-source voltage of the driving TFT in response to a scan signal. The pixel adjusts a display gray level (or a luminance) with an amount of light emitted by the OLED proportional to the driving current. Each pixel may further include an emission TFT that is turned on or off in response to an emission signal and determines an emission time of the OLED.

The OLED display includes a scan driver for generating the scan signal and an emission driver for generating the emission signal. The scan driver and the emission driver constitute a gate driver.

The scan driver sequentially supplies the scan signals to first gate lines. Gate electrodes of the switching TFTs are connected to the scan driver through the first gate lines. The emission driver sequentially supplies the emission signals to second gate lines. Gate electrodes of the emission TFTs are connected to the emission driver through the second gate lines.

The emission driver may be implemented as a gate shift register including a plurality of stages. Each stage outputs the emission signal at a gate high voltage or a gate low voltage depending on a voltage of a node Q and a voltage of a node QB. The emission signal of the gate high voltage is a signal capable of turning off the emission TFTs, and the emission signal of the gate low voltage is a signal capable of turning on the emission TFTs. The emission signal of the gate high voltage is output while the node Q is deactivated, and the emission signal of the gate low voltage is output while the node Q is activated.

When the emission signal of the gate low voltage is output, an initialization operation and an emission operation of the pixels are performed. To secure operation stability of the pixels, the node Q has to maintain an activation state in an initialization period and an emission period. The voltage of the node Q is affected by change in the characteristics of internal elements connected to the node Q. When the electrical characteristics of the internal elements connected to the node Q change due to various factors including a temperature, a bias voltage, deterioration, etc., the voltage of the node Q may swing. Further, the emission signal is not held at the gate low voltage and may increase to a voltage higher than the gate low voltage. In this instance, the reliability of the display device can be greatly reduced.

SUMMARY OF THE INVENTION

Accordingly, an object of the present disclosure is to address the above-described and other problems and provide a gate driver capable of securing operation stability of an emission driver and improving reliability of the emission driver and a display device including the gate driver.

In one aspect, there is provided a gate driver comprising a plurality of stages, wherein each stage includes a transistor T1 configured to apply a start signal to a node Q, a transistor Tu configured to output an emission signal of a gate low voltage to a node Na depending on a voltage of the node Q, a transistor T5 configured to control a voltage of a node QB to be reversed to the voltage of the node Q, a transistor Td configured to output the emission signal of a gate high voltage higher than the gate low voltage to the node Na depending on the voltage of the node QB, and a transistor Tbv connected between the transistor T1 and the node Q and configured to stabilize the voltage of the node Q.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Figure 1:
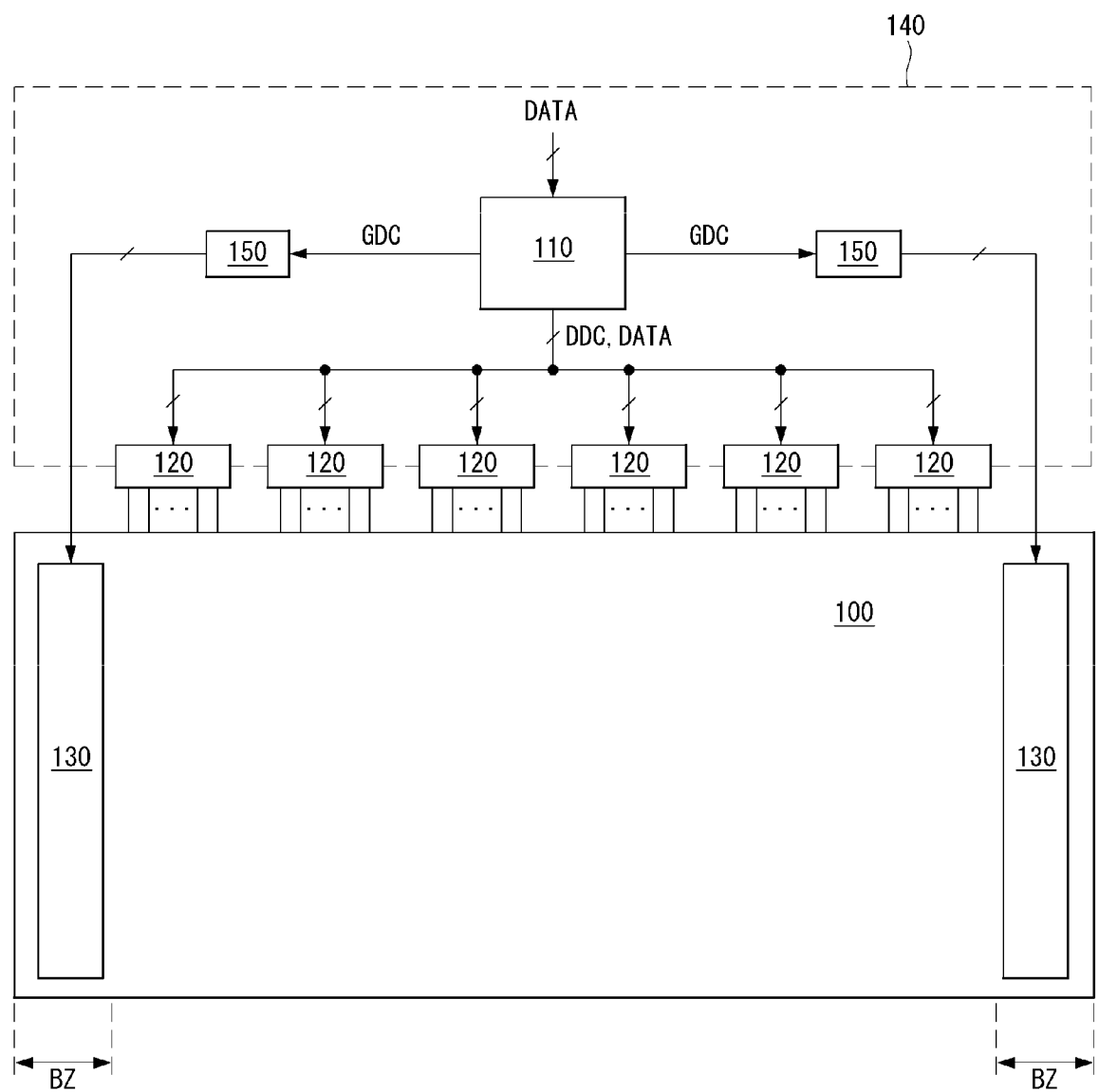
FIG. 1 illustrates a display device according to an embodiment of the disclosure.

Reference will now be made in detail to embodiments of the disclosure, examples of which are illustrated in the accompanying drawings. However, the present disclosure is not limited to embodiments disclosed below, and may be implemented in various forms. These embodiments are provided so that the present disclosure will be described more completely, and will fully convey the scope of the present disclosure to those skilled in the art to which the present disclosure pertains. Particular features of the present disclosure can be defined by the scope of the claims.

Shapes, sizes, ratios, angles, number, and the like illustrated in the drawings for describing embodiments of the disclosure are merely exemplary, and the present disclosure is not limited thereto unless specified as such. Like reference numerals designate like elements throughout. In the following description, when a detailed description of certain functions or configurations related to this document that may unnecessarily cloud the gist of the invention have been omitted.

In the present disclosure, when the terms "include", "have", "comprised of", etc. are used, other components may be added unless "~ only" is used. A singular expression can include a plural expression as long as it does not have an apparently different meaning in context.

In the explanation of components, even if there is no separate description, it is interpreted as including margins of error or an error range.

In the description of positional relationships, when a structure is described as being positioned "on or above", "under or below", "next to" another structure, this description should be construed as including a case in which the structures directly contact each other as well as a case in which a third structure is disposed therebetween.

The terms "first", "second", etc. may be used to describe various components, but the components are not limited by such terms. The terms are used only for the purpose of distinguishing one component from other components. For example, a first component may be designated as a second component, and vice versa, without departing from the scope of the present disclosure.

In embodiments disclosed herein, each of a pixel circuit and a gate driver on a substrate of a display panel can be implemented as transistors of p-type metal oxide semiconductor field effect transistor (MOSFET) structure. However, embodiments are not limited thereto. The transistor is a three-electrode element including a gate, a source, and a drain. The source is an electrode for supplying carriers to the transistor. The carriers inside the transistor begin to flow from the source. The drain is an electrode from which the carriers exit the transistor. Namely, carriers in the MOSFET flow from the source to the drain. In case of a p-type thin film transistor (TFT) (or p-type MOSFET (PMOS)), because carriers are holes, a source voltage is greater than a drain voltage so that holes can flow from a source to a drain. In the p-type TFT, because holes flow from the source to the drain, a current flows from the source to the drain. It should be noted that the source and the drain of the MOSFET are not fixed. For example, the source and the drain of the MOSFET may be changed depending on an applied voltage. Thus, in embodiments disclosed herein, one of the source and the drain is referred to as a first electrode, and the other is referred to as a second electrode.

The following embodiments are described using an organic light emitting diode (OLED) display including an organic light emitting material as an example of a display device. However, it should be noted that the technical idea of the present disclosure is not limited to the OLED display. For example, the present disclosure may be applied to an inorganic electroluminescent display including an inorganic electroluminescent material. All the components of the displays and display devices according to all embodiments of the present disclosure are operatively coupled and configured.

Figure 2:
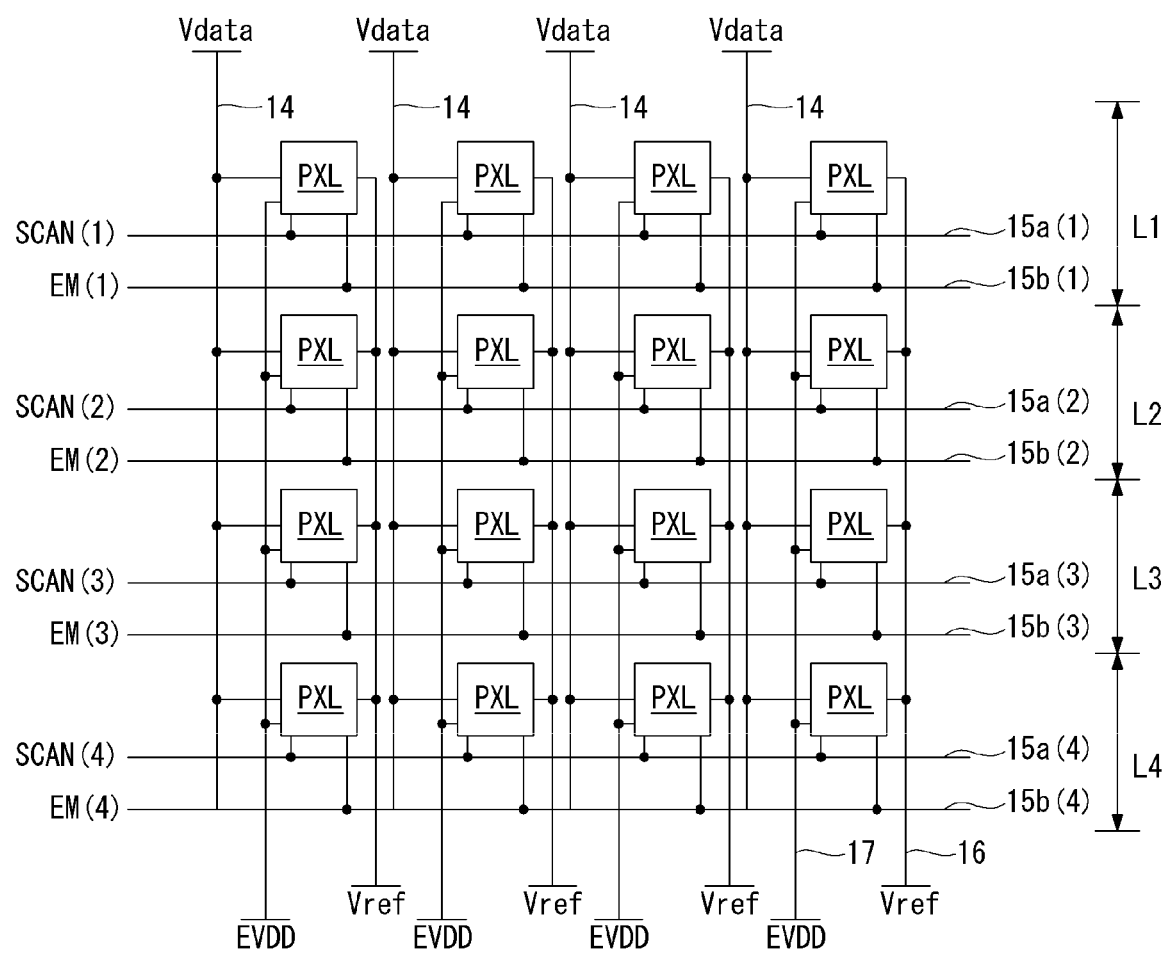
FIG. 2 illustrates a pixel array included in a display panel shown in FIG. 1.
Figure 3:
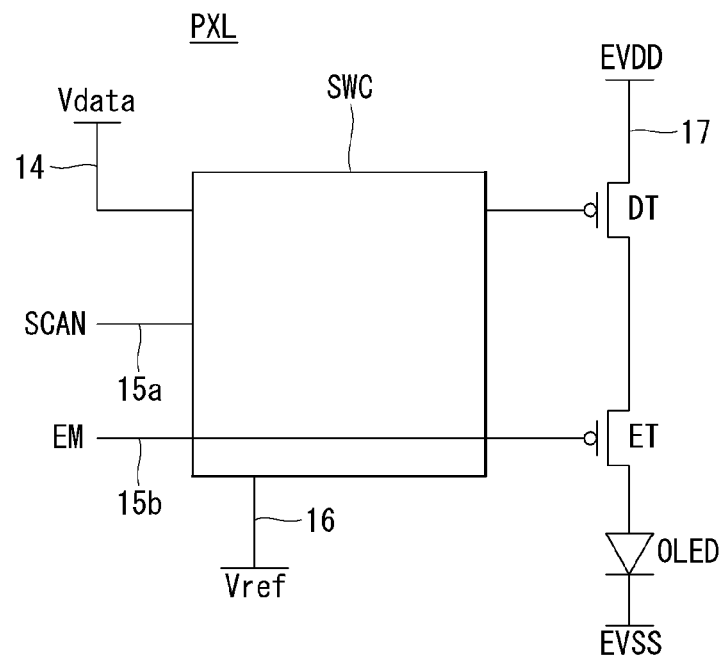
FIG. 3 schematically illustrates a pixel circuit included in a pixel array shown in FIG. 2.
Figure 4:
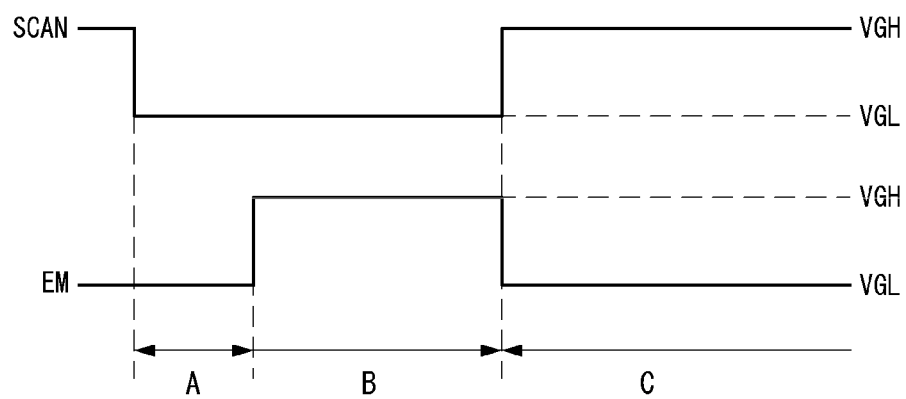
FIG. 4 illustrates a gate signal applied to the pixel circuit shown in FIG. 3.
Figure 5:
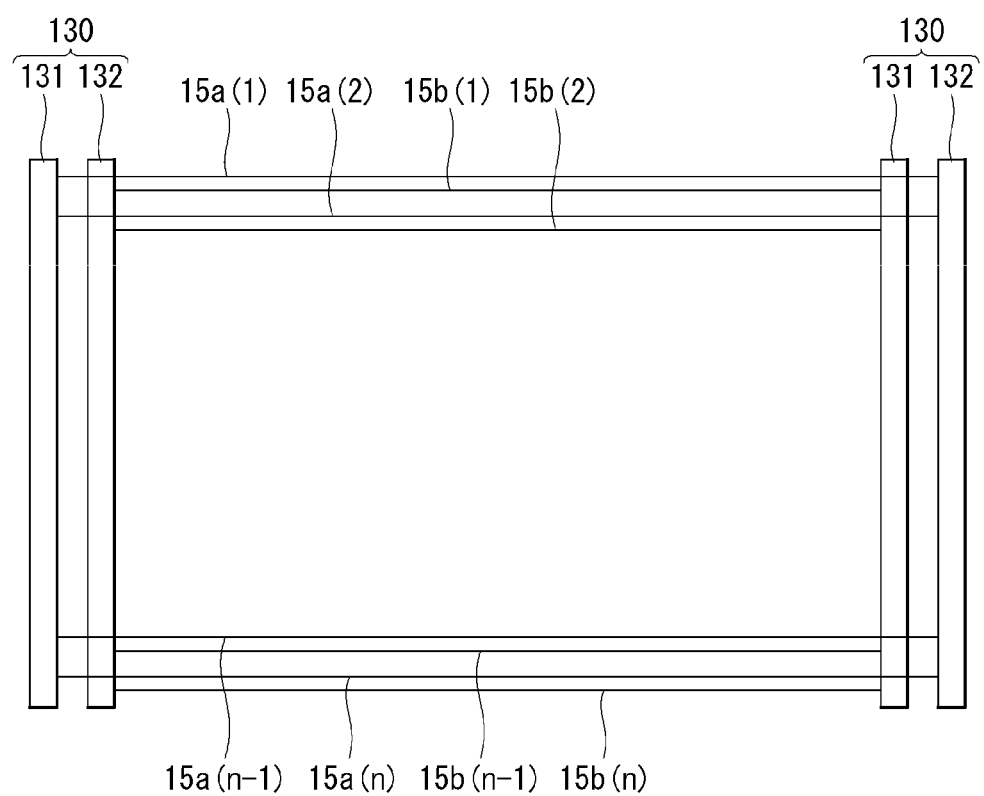
FIG. 5 illustrates a scan driver and an emission driver included in a gate driver shown in FIG. 1.

FIG. 1 illustrates a display device according to an embodiment of the disclosure. FIG. 2 illustrates a pixel array included in a display panel shown in FIG. 1. FIG. 3 schematically illustrates a pixel circuit included in a pixel array shown in FIG. 2. FIG. 4 illustrates a gate signal applied to the pixel circuit shown in FIG. 3. FIG. 5 illustrates a scan driver and an emission driver included in a gate driver shown in FIG. 1.

Referring to FIG. 1, the display device according to an embodiment of the disclosure includes a display panel 100, one or more timing controllers 110, one or more data drivers 120, one or more gate drivers 130, and one or more level shifters 150, and the like.

A plurality of data lines 14 and a plurality of gate lines 15a and 15b are disposed to intersect each other on the display panel 100. Pixels PXL are respectively arranged at intersections of the data lines 14 and the gate lines 15a and 15b in a matrix to form a pixel array.

As shown in FIG. 2, the pixel array of the display panel 100 includes a plurality of horizontal pixel lines L1 to L4. The pixels PXL, which are horizontally adjacent to one another and are commonly connected to the gate lines 15a and 15b, are disposed on each of the horizontal pixel lines L1 to L4. In embodiments disclosed herein, each of the horizontal pixel lines L1 to L4 is not a physical signal line but a block of pixels implemented by horizontally adjacent pixels PXL of one line. The pixel array can include first power lines 17 supplying a high potential power voltage EVDD to the pixels PXL and second power lines 16 supplying a reference voltage Vref to the pixels PXL. Further, the pixels PXL can be connected to an input terminal of a low potential power voltage EVSS.

As shown in FIG. 2, each gate line can include a first gate line 15a supplied with a scan signal SCAN and a second gate line 15b supplied with an emission signal EM.

Each pixel PXL can be one of a red pixel, a green pixel, a blue pixel, and a white pixel for implementation of various colors. A red pixel, a green pixel, a blue pixel, and a white pixel can constitute a unit pixel. A color implemented by the unit pixel can be determined depending on an emission rate of the red pixel, the green pixel, the blue pixel, and the white pixel. Each pixel PXL can be connected to the data line 14, the first gate line 15a, the second gate line 15b, the first power line 17, the second power line 16, and the like.

As shown in FIG. 3, each pixel PXL can include an organic light emitting diode (OLED), a driving thin film transistor (TFT) DT controlling a driving current flowing in the OLED depending on a gate-to-source voltage of the driving TFT DT, a switch circuit SWC for programming the gate-to-source voltage of the driving TFT DT, and an emission TFT ET that is turned on or off in response to the emission signal EM and determines an emission time of the OLED. The switch circuit SWC can include a plurality of switching TFTs, one or more capacitors, and the like. The switch circuit SWC can be variously modified depending on model and specification of the product. The TFTs included in each pixel PXL can be implemented as PMOS low-temperature polycrystalline silicon (LTPS) TFTs, and thus each pixel PXL can secure desired response characteristics through the PMOS LTPS TFTs. However, embodiments are not limited thereto. For example, at least one of the TFTs can be implemented as an NMOS oxide TFT having good off-current characteristics, and other TFTs can be implemented as PMOS LTPS TFTs having good response characteristics.

Each pixel PXL can be driven in response to a gate signal shown in FIG. 4. Each pixel PXL can perform an initialization operation, a programming operation, and an emission operation in response to a scan signal SCAN and an emission signal EM shown in FIG. 4. In an initialization period A, the switch circuit SWC initializes specific nodes of a pixel circuit to the reference voltage Vref and can secure stability and reliability of the initialization operation. In a programming period B, the switch circuit SWC can program the gate-to-source voltage of the driving TFT DT based on a data voltage Vdata, and a threshold voltage of the driving TFT DT can be compensated. In an emission period C, a driving current corresponding to the gate-to-source voltage flows between a source and a drain of the driving TFT DT, and the OLED emits light with the driving current.

The emission TFT ET can be turned on in the initialization period A and the emission period C and can be turned off in the programming period B in response to the emission signal EM.

In FIG. 4, a gate-on voltage is a voltage of the gate signal capable of turning on the TFT, and a gate-off voltage is a voltage of the gate signal capable of turning off the TFT. For example, a gate-on voltage in the PMOS is a gate low voltage VGL, and a gate-off voltage in the PMOS is a gate high voltage VGH higher than the gate low voltage VGL.

Referring to FIG. 1, for each data driver 120, the data driver 120 receives image data DATA from the timing controller 110. The data driver 120 converts the image data DATA into gamma compensation voltages in response to a source timing control signal DDC received from the timing controller 110 and generates data voltages Vdata. The data driver 120 synchronizes the data voltage Vdata with the scan signal SCAN and supplies the data voltage Vdata to the data lines 14 of the display panel 100. The data driver 120 can be connected to the data lines 14 of the display panel 100 through a chip-on glass (COG) process or a tape automated bonding (TAB) process.

Referring to FIG. 1, each level shifter 150 boosts a transistor-transistor logic (TTL) level voltage of a gate timing control signal GDC received from the timing controller 110 to the gate high voltage VGH and the gate low voltage VGL capable of driving the TFTs of the display panel 100 and supplies them to the gate driver(s) 130. The gate timing control signal GDC can include an external start signal, a clock signal, and the like.

Referring to FIG. 1, for each gate driver 130, the gate driver 130 operates in response to the gate timing control signal GDC received from the level shifter 150 and generates the gate signals. The gate driver 130 sequentially supplies the gate signals to the gate lines. The gate driver 130 can be directly formed on a lower substrate of the display panel 100 using a gate driver-in panel (GIP) manner. The gate driver 130 is formed in a non-display area (i.e., a bezel area BZ) outside a screen of the display panel 100. In the GIP manner, the level shifter 150 can be mounted on a printed circuit board (PCB) 140 together with the timing controller 110.

As shown in FIG. 5, the gate drivers 130 are disposed on opposite sides of the display panel 100 in a double bank structure and can reduce signal distortion resulting from a load variation. The gate driver 130 includes a scan driver 131 generating the scan signal SCAN and an emission driver 132 generating the emission signal EM.

The scan driver 131 can supply the scan signals SCAN to first gate lines 15a(1) to 15a(n) in a line sequential manner. The emission driver 132 can supply the emission signals EM to second gate lines 15b(1) to 15b(n) in a line sequential manner. The emission driver 132 can be implemented as a gate shift register including a plurality of stages. Each stage of the emission driver 132 can be implemented as shown in FIGS. 6 to 9G in order to secure stability and reliability of an operation.

Referring to FIG. 1, the timing controller 110 can be connected to an external host system through known various interface manners. The timing controller 110 receives the image data DATA from the host system. The timing controller 110 can correct the image data DATA and then transmit the corrected image data DATA to the data drivers 120, so that a luminance variation resulting from a difference between electrical characteristics of the pixels PXL is compensated.

The timing controller 110 receives timing signals such as a vertical sync signal Vsync, a horizontal sync signal Hsync, a data enable signal DE, and a main clock MCLK from the host system. The timing controller 110 can generate the gate timing control signal GDC and the source timing control signal DDC based on the timing signals.

Figure 6:
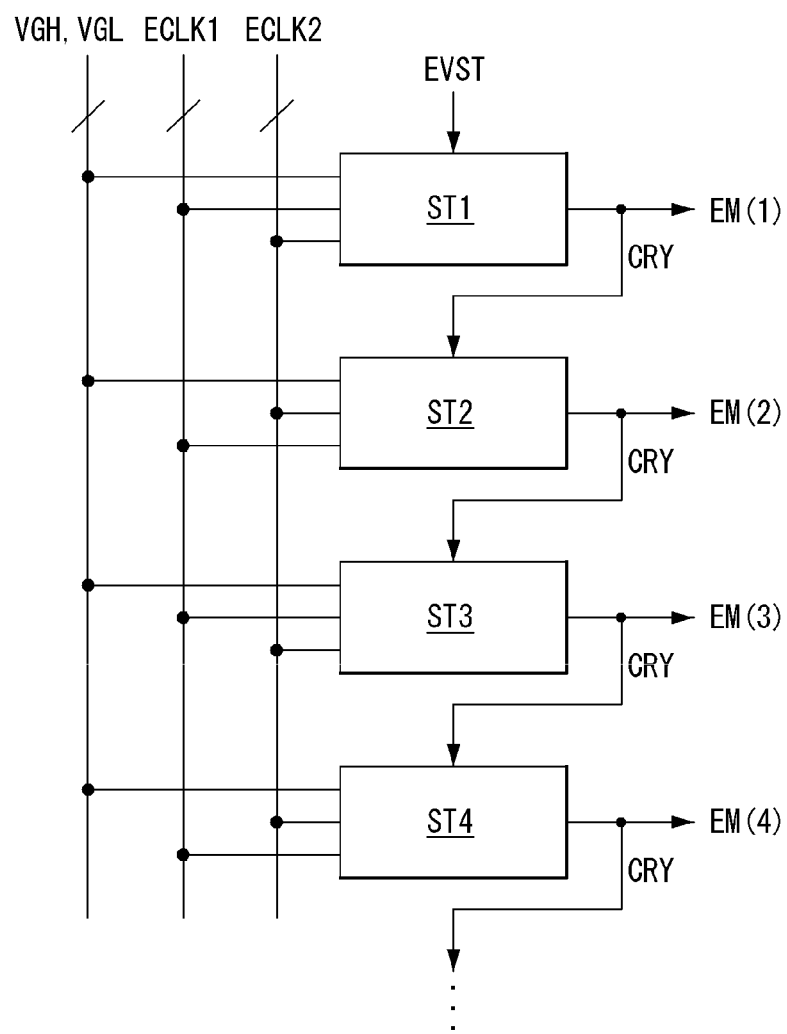
FIG. 6 illustrates configuration of a gate shift register included in an emission driver shown in FIG. 5.

FIG. 6 illustrates configuration of example of a gate shift register included in the emission driver shown in FIG. 5.

Referring to FIG. 6, the emission driver 132 according to the embodiment of the disclosure can be implemented as a gate shift register including a plurality of stages ST1 to ST4, . . . . Although 5 stages are discussed, the stages can be in different numbers. The stages ST1 to ST4, . . . can be GIP elements formed in the GIP manner.

Operations of the stages ST1 to ST4, . . . are sequentially activated in response to a start signal and output emission signals EM(1) to EM(4), . . . An operation of the uppermost stage ST1 is activated in response to an external start signal EVST, and operations of the second uppermost stage ST2 below the uppermost stage ST1 to a lowermost stage are activated in response to an emission signal of a preceding stage. The emission signal of the preceding stage is used as an internal start signal and is a carry signal CRY. In embodiments disclosed herein, "preceding stage" is a stage that is activated earlier than a reference stage and generates an emission signal of which a phase is earlier than a phase of an emission signal output from the reference stage.

The stages ST1 to ST4, . . . receive the external start signal EVST, a first clock signal ECLK1, and a second clock signal ECLK2 from the level shifter 150 in order to output the emission signals EM(1) to EM(4), . . . The external start signal EVST, the first clock signal ECLK1, and the second clock signal ECLK2 can swing between the gate high voltage VGH and the gate low voltage VGL.

The external start signal EVST is input to the uppermost stage ST1, and the first clock signal ECLK1 and the second clock signal ECLK2 are input to all the stages ST1 to ST4, . . . The first clock signal ECLK1 and the second clock signal ECLK2 are in antiphase. Thus, input positions of the first clock signal ECLK1 and the second clock signal ECLK2 in odd-numbered stages can be set to be opposite to those in even-numbered stages, in order to normally operate each of the stages that are connected in cascade. For example, when the first clock signal ECLK1 is input to first terminals of the odd-numbered stages and the second clock signal ECLK2 is input to second terminals of the odd-numbered stages, the first clock signal ECLK1 can be input to second terminals of the even-numbered stages and the second clock signal ECLK2 can be input to first terminals of the even-numbered stages.

Each of the stages ST1 to ST4, . . . activates an operation of a node Q in response to the start signal applied to a start terminal in each frame. In embodiments disclosed herein, the fact that a node is activated indicates that the gate low voltage VGL or a voltage corresponding to the gate low voltage VGL is applied to the node. Further, the fact that a node is deactivated indicates that the gate high voltage VGH or a voltage corresponding to the gate high voltage VGH is applied to the node.

Each of the stages ST1 to ST4, . . . receives the gate high voltage VGH and the gate low voltage VGL from an external power supply unit. For example, the gate high voltage VGH can be set to 20V to 30V, and the gate low voltage VGL can be set to −10V to 0V. However, embodiments are not limited thereto.

Figure 7:
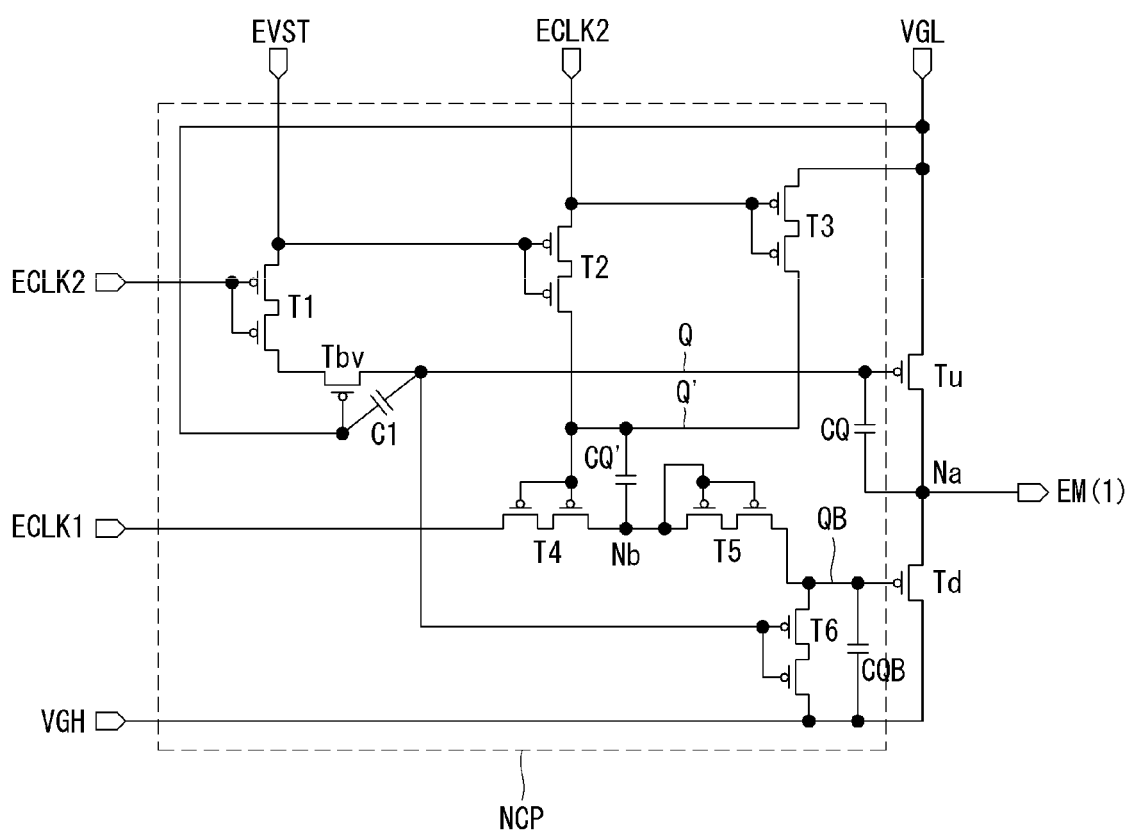
FIG. 7 illustrates configuration of a stage included in the gate shift register shown in FIG. 6.

FIG. 7 illustrates configuration of the uppermost stage ST1 included in the gate shift register shown in FIG. 6.

Configurations of the remaining odd-numbered stages except the uppermost stage ST1 are substantially the same as configuration of the uppermost stage ST1, except that they receive the internal start signal CRY instead of the external start signal EVST and each output a corresponding emission signal. Further, configurations of the even-numbered stages are substantially the same as configuration of the uppermost stage ST1, except that they receive the internal start signal CRY instead of the external start signal EVST, receives the second clock signal ECLK2 instead of the first clock signal ECLK1, receives the first clock signal ECLK1 instead of the second clock signal ECLK2, and each output a corresponding emission signal.

Referring to FIG. 7, the stage ST1 outputs an emission signal EM(1) of the gate high voltage VGH while the node Q is deactivated to the gate high voltage VGH and a node QB is activated to the gate low voltage VGL. Further, the stage ST1 outputs the emission signal EM(1) of the gate low voltage VGL while the node Q is activated to the gate low voltage VGL and the node QB is deactivated to the gate high voltage VGH.

To this end, the stage ST1 can include a transistor Tu outputting the emission signal EM(1) of the gate low voltage VGL to a node Na, a transistor Td outputting the emission signal EM(1) of the gate high voltage VGH to the node Na, and a node controller NCP controlling voltages of nodes Q, Q' and QB.

The transistor Tu is an output buffer of which an operation is controlled depending on the voltage of the node Q. The transistor Tu is turned off when the node Q is deactivated to the gate high voltage VGH, and is turned on when the node Q is activated to the gate low voltage VGL. A gate electrode of the transistor Tu is connected to the node Q, a first electrode of the transistor Tu is connected to the node Na, and a second electrode of the transistor Tu is connected to an input terminal of the gate low voltage VGL.

The transistor Td is an output buffer of which an operation is controlled depending on the voltage of the node QB. The transistor Td is turned off when the node QB is deactivated to the gate high voltage VGH, and is turned on when the node QB is activated to the gate low voltage VGL. A gate electrode of the transistor Td is connected to the node QB, a first electrode of the transistor Td is connected to an input terminal of the gate high voltage VGH, and a second electrode of the transistor Td is connected to the node Na.

The node controller NCP controls the voltage of the node Q, the voltage of the node QB, and the voltage of the node Q' between the input terminal of the gate low voltage VGL and the node QB based on an external start signal EVST of which a phase is earlier than a phase of the emission signal EM(1), the first clock signal ECLK1 and the second clock signal ECLK2 that are in antiphase, the gate low voltage VGL, and the gate high voltage VGH.

The node controller NCP controls the voltage of the node Q and the voltage of the node QB to be reversed for a remaining time excluding an initial time (e.g., a period ② of FIG. 8) from one frame. For example, for the remaining time, when the voltage of the node Q is the gate high voltage VGH, the voltage of the node QB can be the gate low voltage VGL. On the contrary, when the voltage of the node Q is the gate low voltage VGL, the voltage of the node QB can be the gate high voltage VGH.

The voltage of the node Q is affected by change in characteristics of internal elements included in the node controller NCP. When electrical characteristics of the internal elements change due to various factors including a temperature, a bias voltage, deterioration, etc., the voltage of the node Q can swing for a certain period of time (for example, including periods ⑥ and ⑦ of FIG. 8). Further, the emission signal EM(1) is not held at the gate low voltage VGL and can increase to a voltage level higher than the gate low voltage VGL. Even when the voltage of the node QB swings, the emission signal EM(1) is not held at the gate high voltage VGH and can decrease to a voltage level lower than the gate high voltage VGH for a predetermined time (for example, including periods ③, ④ and ⑤ of FIG. 8). In this instance, the reliability of the display device can be greatly reduced.

The node controller NCP includes a plurality of stabilization configurations and stabilizes the voltages of the node Q and the node QB.

The node controller NCP includes at least one of a connection configuration of a transistor Tbv and a transistor T2 and a capacitor CQ to thereby simplify circuit configuration of the stage and to stabilize the voltage of the node Q for the certain period of time. Through the above stabilization configurations, the node controller NCP can hold the voltage of the node Q at the gate low voltage VGL capable of turning on the transistor Tu for the certain period of time from a time at which the emission signal EM(1) is inverted from the gate high voltage VGH to the gate low voltage VGL. Further, for the certain period of time, the node controller NCP can hold the voltage of the node QB at the gate high voltage VGH capable of turning off the transistor Td and can swing the voltage of the node Q' between the gate low voltage VGL and the gate high voltage VGH in synchronization with the second clock signal ECLK2. Hence, the operation stability and the operation reliability of the stage ST1 can be secured.

The node controller NCP includes a capacitor CQB to thereby stabilize the voltage of the node QB for the predetermined time. Hence, the operation reliability of the stage ST1 can further increase.

More specifically, the node controller NCP can include a plurality of transistors T1 to T6 and Tbv and a plurality of capacitors CQ, CQ' and CQB.

Each of the plurality of transistors T1 to T6 can be designed in a dual gate structure, in order to suppress a leakage current when the transistor is turned off. In the dual gate structure, a first gate electrode and a second gate electrode of the transistor are connected to each other so that they have the same voltage level. A channel length of the dual gate structure is longer than a channel length of a single gate structure. Because an increase in the channel length results in an increase in a resistance, the leakage current decreases when the transistor is turned off. Hence, the operation stability can be secured.

The transistor T1, the transistor Tbv, and the capacitor CQ are elements controlling the voltage of the node Q.

The transistor T1 applies the external start signal EVST to the node Q in response to the second clock signal ECLK2. A gate electrode of the transistor T1 is connected to an input terminal of the second clock signal ECLK2. A first electrode of the transistor T1 is connected to a start terminal to which the external start signal EVST is input, and a second electrode of the transistor T1 is connected to one electrode of the transistor Tbv.

The transistor Tbv is connected between the transistor T1 and the node Q and stabilizes the voltage of the node Q to the gate low voltage VGL for the certain period of time, thereby preventing distortion of the emission signal EM(1). To this end, a capacitor C1 is provided between a gate electrode of the transistor Tbv and the node Q to stabilize the voltage of the node Q. The gate electrode of the transistor Tbv is connected to the input terminal of the gate low voltage VGL. A first electrode of the transistor Tbv is connected to the transistor T1, and a second electrode of the transistor Tbv is connected to the node Q.

The transistor Tbv is connected between the transistor T1 and the node Q and prevents a breakdown phenomenon, thereby protecting the GIP elements. If the transistor T1 is directly connected to the node Q, a source-to-drain voltage of the transistor T1 can increase depending on change in the voltage of the node Q, and a load applied to the transistor T1 can increase. However, the transistor Tbv according to the embodiment of the disclosure can reduce an influence of the node Q applied to the transistor T1 and thus protect the transistor T1.

The capacitor CQ is connected between the node Q and the node Na. The capacitor CQ couples the node Q to the node Na to which the emission signal EM(1) is output, thereby stabilizing the voltage of the node Q.

The transistor T2, the transistor T3, the transistor T4, and the capacitor CQ' are elements controlling the voltage of the node Q'.

The transistor T2 applies the second clock signal ECLK2 to the node Q' in response to the external start signal EVST. A gate electrode of the transistor T2 is connected to the start terminal to which the external start signal EVST is input. A first electrode of the transistor T2 is connected to the input terminal of the second clock signal ECLK2, and a second electrode of the transistor T2 is connected to the node Q'.

The transistor T3 applies the gate-low voltage VGL to the node Q' in response to the second clock signal ECLK2. A gate electrode of the transistor T3 is connected to the input terminal of the second clock signal ECLK2. A first electrode of the transistor T3 is connected to the input terminal of the gate low voltage VGL, and a second electrode of the transistor T3 is connected to the node Q'.

The transistor T4 applies the first clock signal ECLK1 to a node Nb depending on the voltage of the node Q'. A gate electrode of the transistor T4 is connected to the node Q'. A first electrode of the transistor T4 is connected to an input terminal of the first clock signal ECLK1, and a second electrode of the transistor T4 is connected to the node Nb.

The capacitor CQ' is connected between the node Q' and the node Nb. The capacitor CQ' bootstraps the voltage of the node Q' to a voltage less than the gate low voltage VGL in response to the first clock signal ECLK1.

The transistor T5, the transistor T6, and the capacitor CQB are elements controlling the voltage of the node QB.

The transistor T5 is diode-connected between the node Nb and the node QB. The transistor T5 is turned on when the node Q' is bootstrapped, and thus reduces the voltage of the node QB to the gate low voltage VGL. Because the voltage of the node Nb can be stably and rapidly reduced to the gate low voltage VGL due to the bootstrapping of the node Q', operation stability of the transistor T5 is secured. A gate electrode and a first electrode of the transistor T5 are connected to the node Nb, and a second electrode of the transistor T5 is connected to the node QB.

The transistor T6 controls the current flowing between the input terminal of the gate high voltage VGH and the node QB depending on the voltage of the node Q. When the node Q is activated to the gate low voltage VGL, the transistor T6 connects the node QB to the input terminal of the gate high voltage VGH and deactivates the node QB to the gate high voltage VGH.

The capacitor CQB is connected between the node QB and the input terminal of the gate high voltage VGH. When the node QB is coupled to the input terminal of the gate high voltage VGH, the voltage of the node QB can be stably held even while the node QB is floated.

Figure 8:
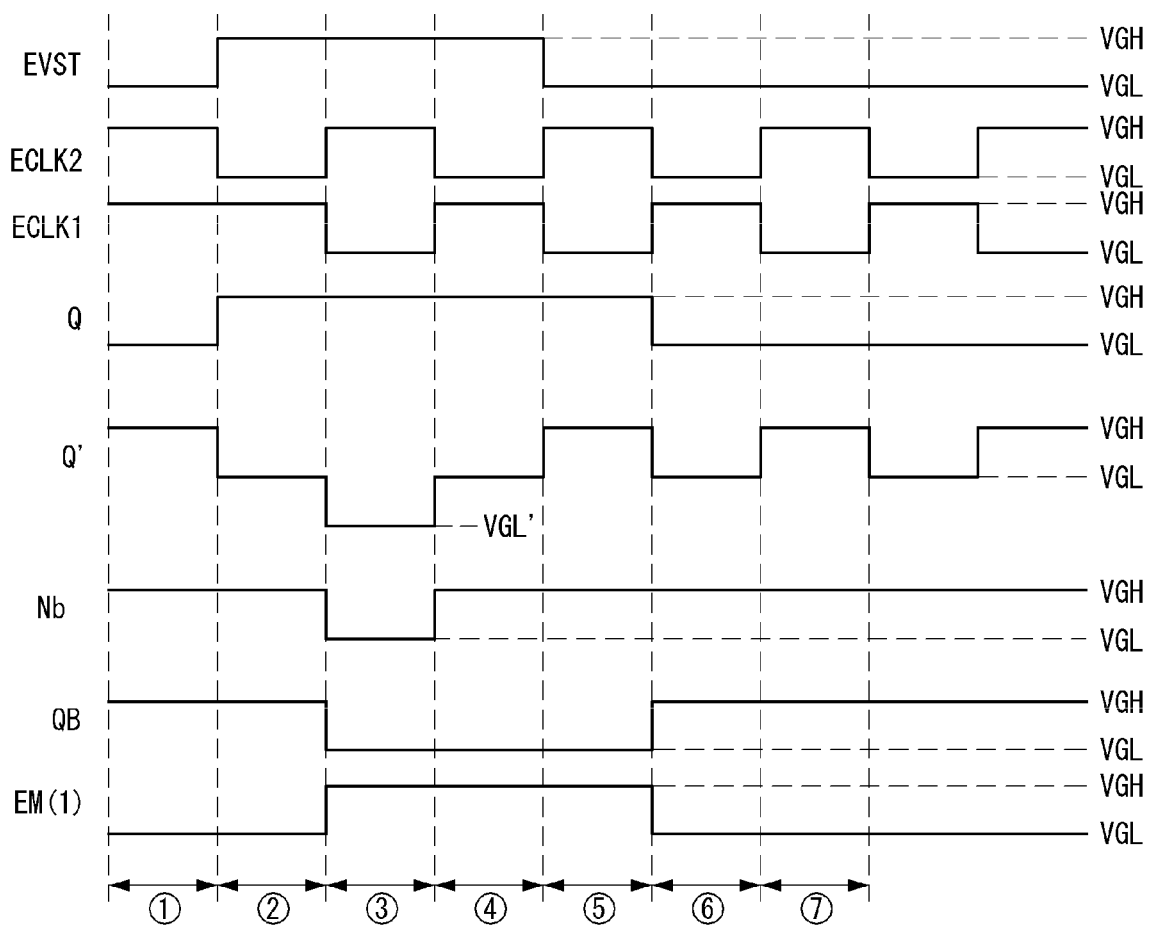
FIG. 8 illustrates an operation waveform of a stage shown in FIG. 7.

FIG. 8 illustrates an operation waveform of the stage shown in FIG. 7. FIGS. 9A to 9G illustrate operation states of a stage respectively corresponding to periods ① to ⑦ shown in FIG. 8.

Figure 9A:
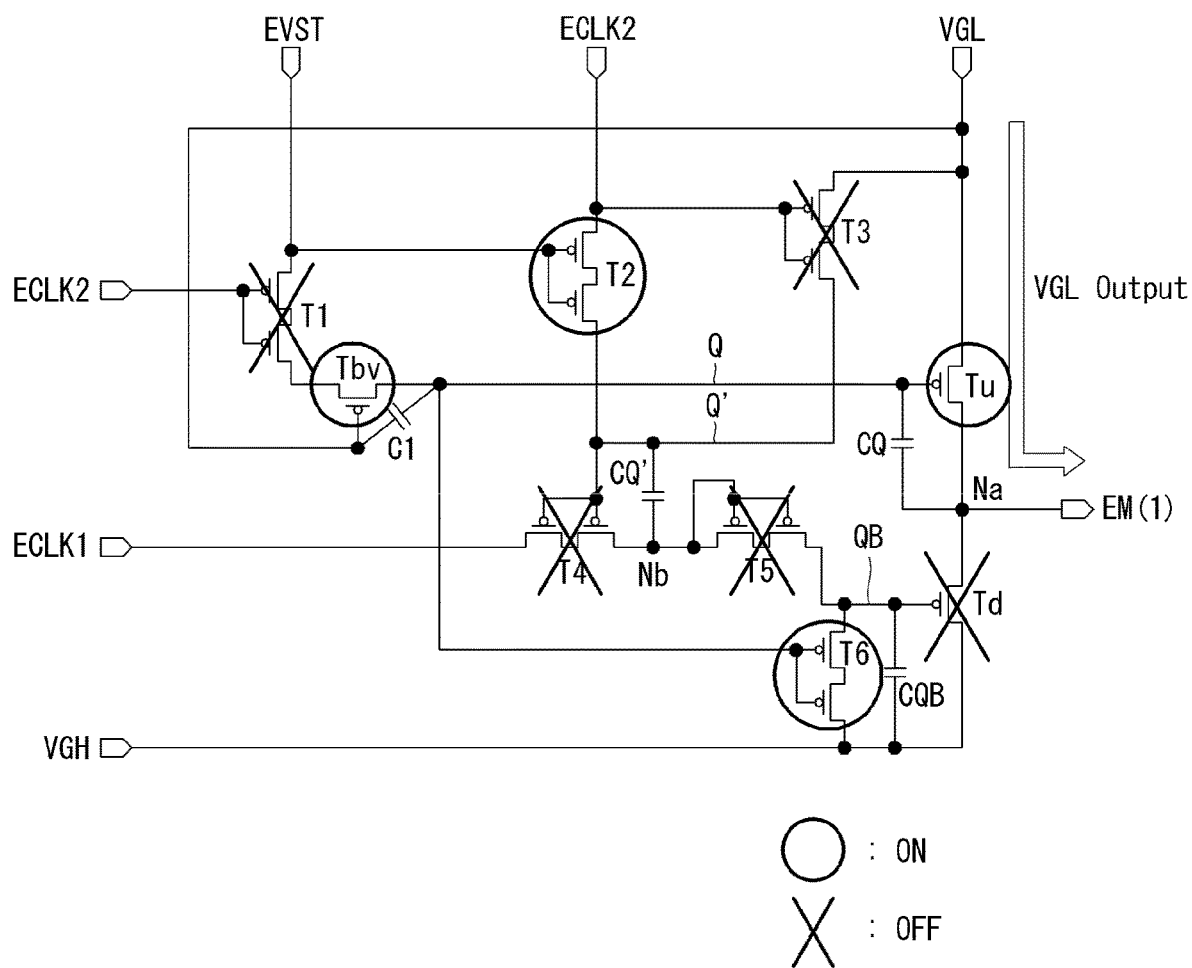
FIGS. 9A to 9G illustrate operation states of a stage respectively corresponding to periods ① to ⑦ shown in FIG. 8.

Referring to FIGS. 8 and 9A, in a period ①, the external start signal EVST is input at the gate low voltage VGL, and the first and second clock signals ECLK1 and ECLK2 are input at the gate high voltage VGH.

In the period ①, the transistor T2 is turned on in response to the external start signal EVST of the gate low voltage VGL, and the transistors T1 and T3 are turned off in response to the second clock signal ECLK2 of the gate high voltage VGH.

In the period ①, the node Q is floated by the turn-off of the transistor T1. However, the voltage of the node Q is stabilized by the capacitor C1 coupled to the gate electrode of the transistor Tbv and the capacitor CQ coupled to the node Na. The node Q is activated to the gate low voltage VGL. The transistors T6 and Tu are turned on in response to the activated node Q.

In the period ①, the node Q' is deactivated to the gate high voltage VGH by the second clock signal ECLK2 applied through the transistor T2. The transistor T4 is turned off in response to the deactivated node Q'. In this instance, the node Nb is held at the gate high voltage VGH, and thus the transistor T5 is turned off.

In the period ①, the node QB is deactivated by the gate high voltage VGH applied through the transistor T6. The transistor Td is turned off in response to the deactivated node QB.

As a result, in the period ①, the emission signal EM(1) of the gate low voltage VGL is output to the node Na via the transistor Tu.

Figure 9B:
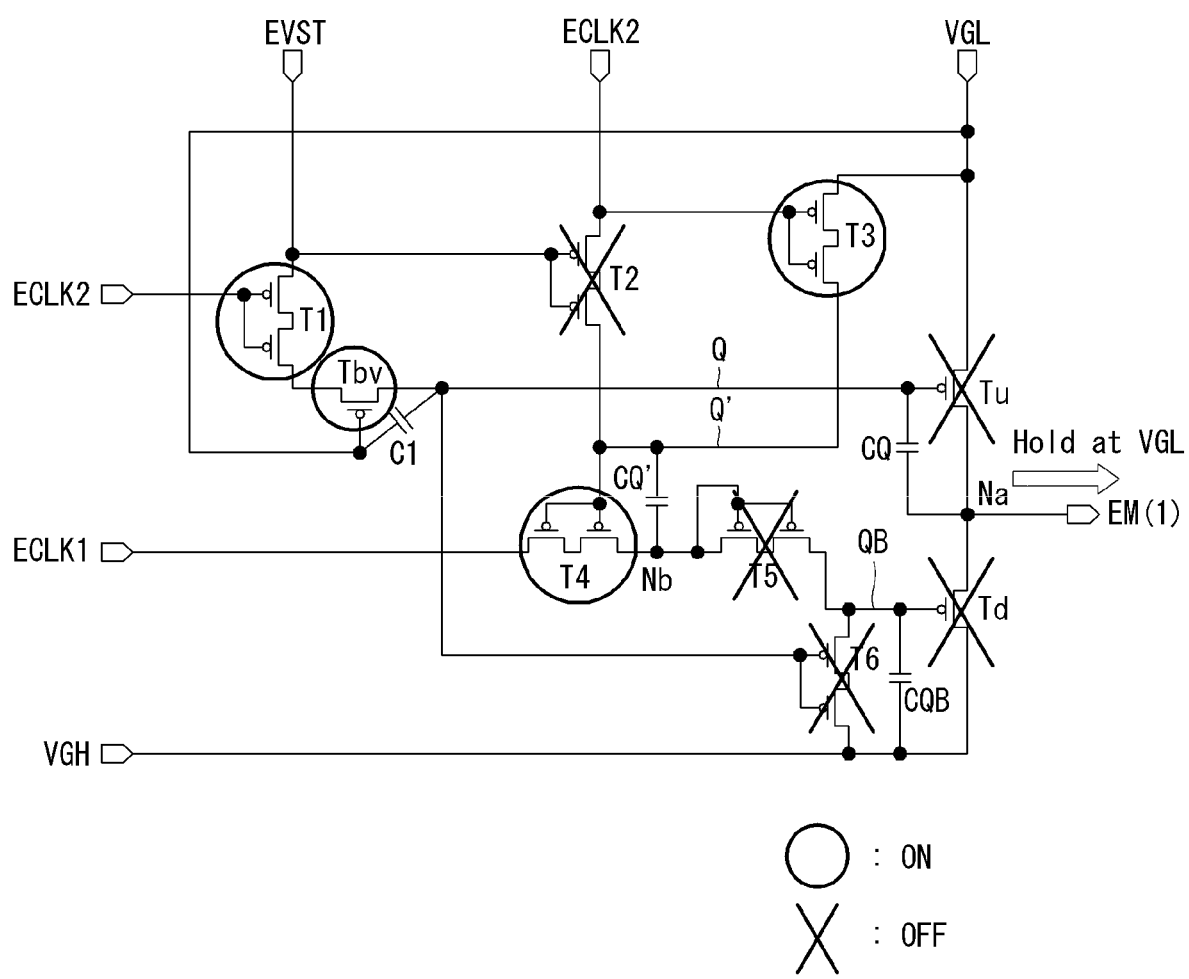

Referring to FIGS. 8 and 9B, in a period ②, the external start signal EVST and the first clock signal ECLK1 are input at the gate high voltage VGH, and the second clock signal ECLK2 is input at the gate low voltage VGL.

In the period ②, the transistor T2 is turned off in response to the external start signal EVST of the gate high voltage VGH, and the transistor T5 is turned off in response to the first clock signal ECLK1 of the gate high voltage VGH. Further, the transistors T1 and T3 are turned on in response to the second clock signal ECLK2 of the gate low voltage VGL.

In the period ②, the node Q is deactivated to the gate high voltage VGH by the external start signal EVST applied through the transistor T1. The transistors T6 and Tu are turned off in response to the deactivated node Q.

In the period ②, the node Q' is activated by the gate low voltage VGL applied through the transistor T3. The transistor T4 is turned on in response to the activated node Q'. The voltage of the node Nb is the gate high voltage VGH by the first clock signal ECLK1 applied through the transistor T4. The transistor T5 is turned off by the node Nb of the gate high voltage VGH.

In the period ②, the node QB is floated by the turn-off of the transistor T6. However, the voltage of the node QB is held at the gate high voltage VGH of the period ① due to the capacitor CQB. The transistor Td is turned off in response to the node QB of the gate high voltage VGH.

In the period ②, the node Na is floated by the turn-off of the transistors Tu and Td. However, the voltage of the node Na is held at the gate low voltage VGL of the period ① due to the capacitor CQ. In other words, in the period ②, the emission signal EM(1) is held at the gate low voltage VGL.

Figure 9C:
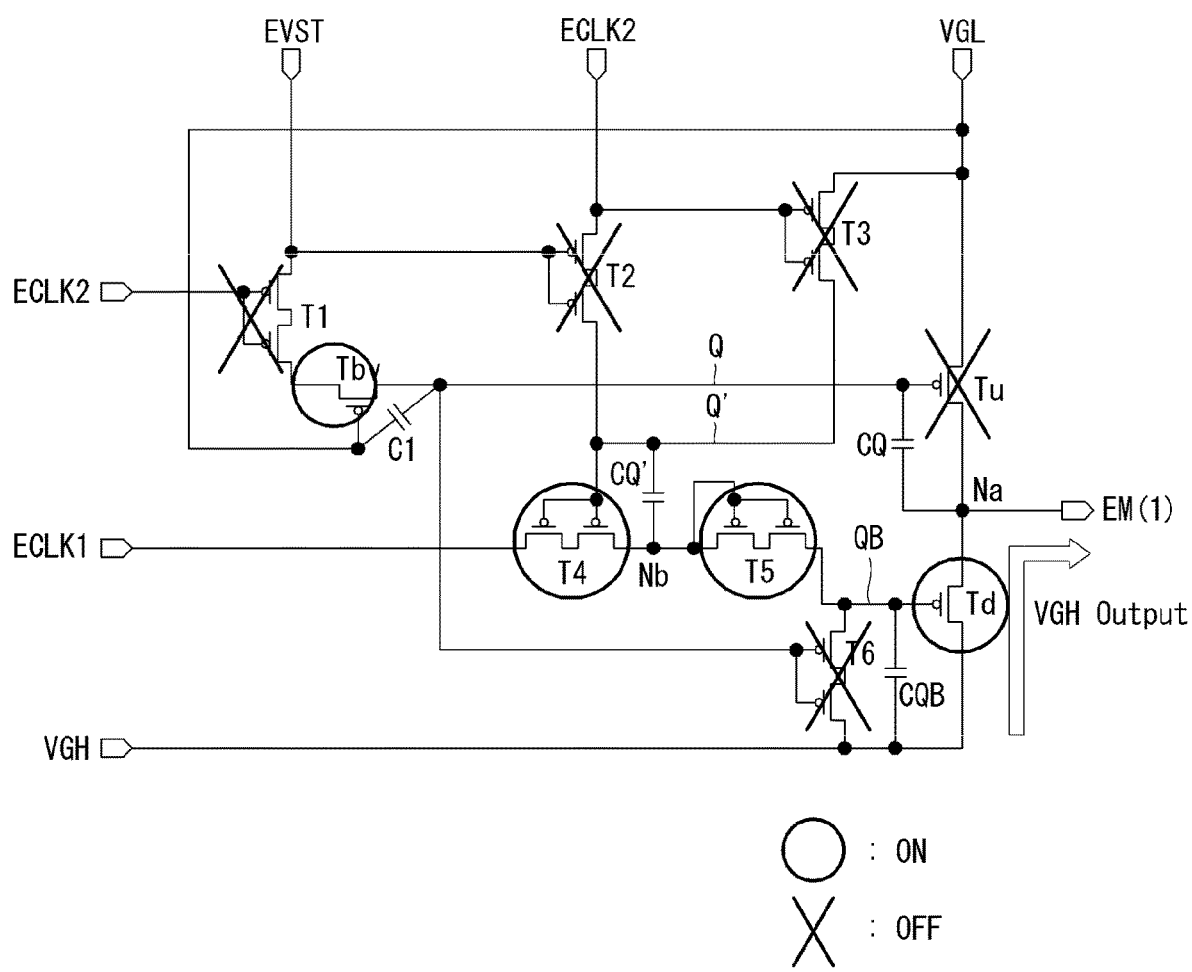

Referring to FIGS. 8 and 9C, in a period ③, the external start signal EVST and the second clock signal ECLK2 are input at the gate high voltage VGH, and the first clock signal ECLK1 is input at the gate low voltage VGL.

In the period ③, the transistor T2 is turned off in response to the external start signal EVST of the gate high voltage VGH, and the transistor T5 is turned on in response to the first clock signal ECLK1 of the gate low voltage VGL. Further, the transistors T1 and T3 are turned off in response to the second clock signal ECLK2 of the gate high voltage VGH.

In the period ③, the node Q is floated by the turn-off of the transistor T1. Further, the node Q is held at the gate high voltage VGH of the period ② and is deactivated. The transistors T6 and Tu are turned off in response to the deactivated node Q.

In the period ③, the voltage of the node Nb is reduced to the gate low voltage VGL by the first clock signal ECLK1 applied through the transistor T4. In this instance, because the node Q' is floated and is coupled to the node Nb through the capacitor CQ', the voltage of the node Q' is reduced by a reduction in the voltage of the node Nb. In other words, the voltage of the node Q' is bootstrapped from the gate low voltage VGL of the period ② to a voltage VGL' less than the gate low voltage VGL and maintains an activation state. The transistor T4 is turned on in response to the node Q' of the activation state, and the voltage of the node Nb is rapidly stabilized to the gate low voltage VGL. The transistor T5 is stably turned on in response to the node Nb of the gate low voltage VGL. When the transistor T5 is stably turned on, change in the voltage of the node QB depending on the first clock signal ECLK1 is stabilized.

In the period ③, the node QB is activated to the gate low voltage VGL by the first clock signal ECLK1 applied through the transistors T4 and T5. The transistor Td is turned on in response to the activated node QB.

As a result, in the period ③, the emission signal EM(1) of the gate high voltage VGH is output to the node Na via the transistor Td. Namely, the emission signal EM(1) is inverted to the gate high voltage VGH.

Figure 9D:
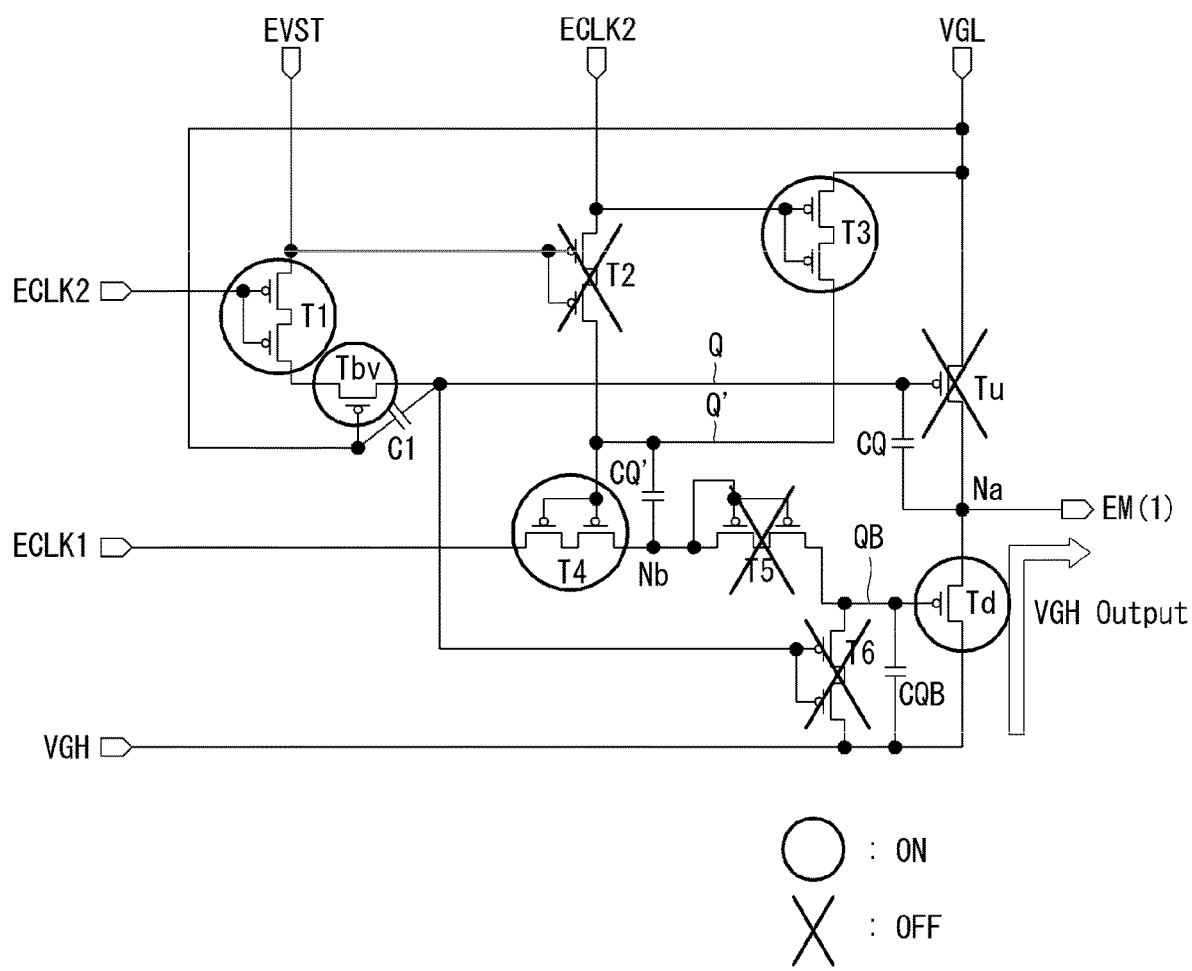

Referring to FIGS. 8 and 9D, in a period ④, the external start signal EVST and the first clock signal ECLK1 are input at the gate high voltage VGH, and the second clock signal ECLK2 is input at the gate low voltage VGL.

In the period ④, the transistor T2 is turned off in response to the external start signal EVST of the gate high voltage VGH, and the transistor T5 is turned off in response to the first clock signal ECLK1 of the gate high voltage VGH. Further, the transistors T1 and T3 are turned on in response to the second clock signal ECLK2 of the gate low voltage VGL.

In the period ④, the node Q is deactivated to the gate high voltage VGH by the external start signal EVST applied through the transistor T1. The transistors T6 and Tu are turned off in response to the deactivated node Q.

In the period ④, the voltage of the node Q' increases from the bootstrapping voltage VGL' to the gate low voltage VGL due to the gate low voltage VGL applied through the transistor T3. The transistor T4 maintains a turn-on state in response to the node Q' of the gate low voltage VGL. The voltage of the node Nb is the gate high voltage VGH by the first clock signal ECLK1 applied through the transistor T4. The transistor T5 is turned off by the node Nb of the gate high voltage VGH.

In the period ④, the node QB is floated by the turn-off of the transistor T6. However, the voltage of the node QB is held at the gate low voltage VGL of the period ③ due to the capacitor CQB. The transistor Td is turned on in response to the node QB of the gate low voltage VGL.

As a result, in the period ④, the emission signal EM(1) of the gate high voltage VGH is output to the node Na via the transistor Td. Namely, the emission signal EM(1) is held at the gate high voltage VGH.

The operation of the stage in the periods ① to ④ is summarized in Table 1 below.

TABLE 1

|  | Period ① | Period ② | Period ③ | Period ④ |
|---|---|---|---|---|
| EVST | EVST "VGL" → T2 "ON" | EVST "VGH" → T2 "OFF" | EVST "VGH" → T2 "OFF" | EVST "VGH" → T2 "OFF" |
| ECLK1 | ECLK1 "VGH" | ECLK1 "VGH" → T5 "OFF" | ECLK1 "VGL" → T5 "ON" | ECLK1 "VGH" → T5 "OFF" |
| ECLK2 | ECLK2 "VGH" → T1 and T3 "OFF" | ECLK2 "VGL" → T1 and T3 "ON" | ECLK2 "VGH" → T1 and T3 "OFF" | ECLK2 "VGL" → T1 and T3 "ON" |
| Q node | Q node "VGL" → T6 and Tu "ON" | Q node "VGH" → T6 and Tu "OFF" | Q node "VGH" hold → T6 and Tu "OFF" | Q node "VGH" → T6 and Tu "OFF" |
| Q' node | Q' node "VGH" → T4 and T5 "OFF" | Q' node "VGL" → T4 "ON" | Q' node "VGL" (bootstrapping) → T4 "ON" | Q' node "VGL" → T4 "ON" |
| QB node | QB node "VGH" → Td "OFF" | QB node "VGH" hold → Td "OFF" | QB node "VGL" → Td "ON" | QB node "VGL" hold → Td "ON" |
| EM Output | EM(1) "VGL" | EM(1) "VGL" hold | EM(1) "VGH" | EM(1) "VGH" hold |

Figure 9E:
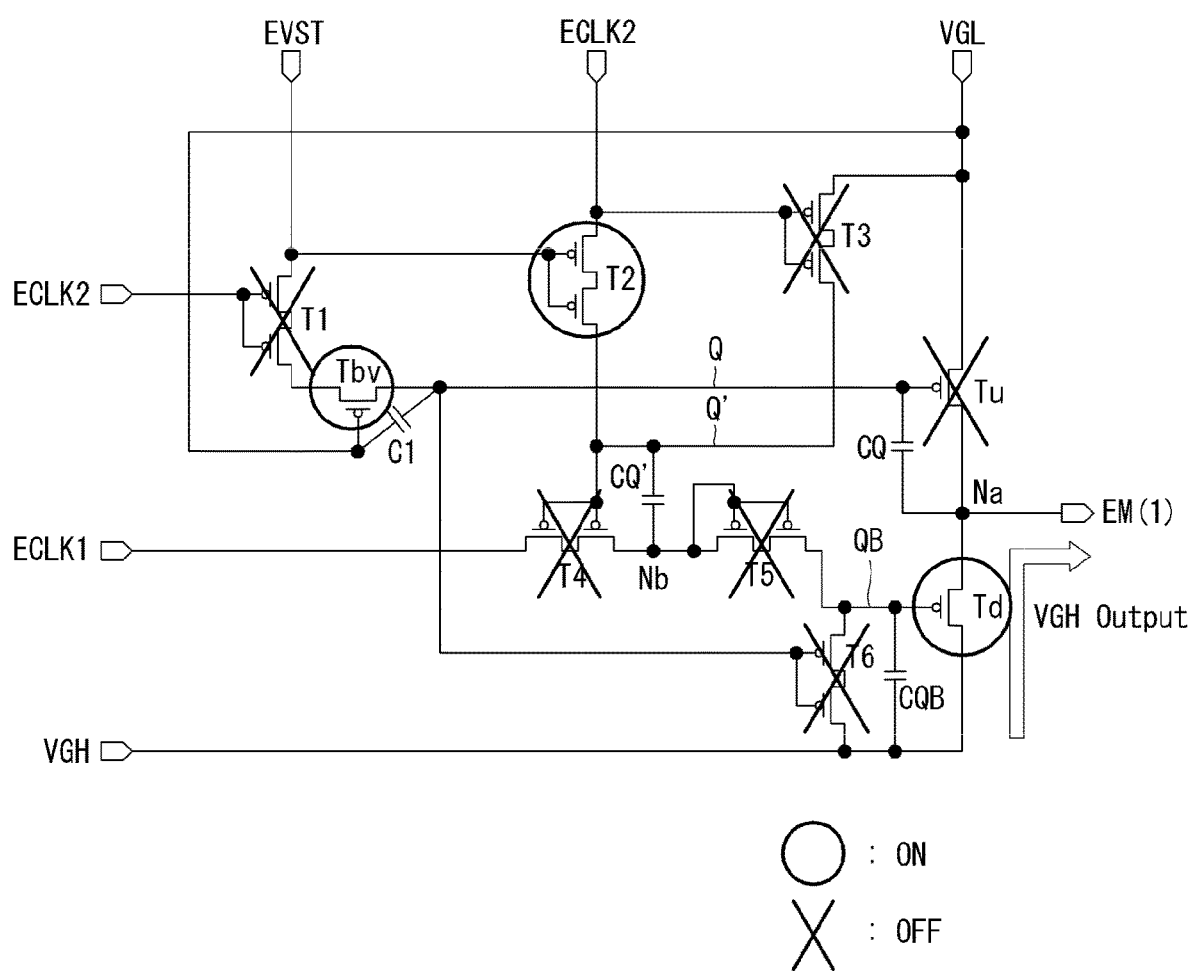

Subsequently, referring to FIGS. 8 and 9E, in a period ⑤, the external start signal EVST and the first clock signal ECLK1 are input at the gate low voltage VGL, and the second clock signal ECLK2 is input at the gate high voltage VGH.

In the period ⑤, the transistor T2 is turned on in response to the external start signal EVST of the gate low voltage VGL, and the transistors T1 and T3 are turned off in response to the second clock signal ECLK2 of the gate high voltage VGH.

In the period ⑤, the node Q is floated by the turn-off of the transistor T1. Further, the node Q is held at the gate high voltage VGH of the period ④ and is deactivated. The transistors T6 and Tu are turned off in response to the deactivated node Q.

In the period ⑤, the node Q' is deactivated to the gate high voltage VGH by the second clock signal ECLK2 applied through the transistor T2. The transistor T4 is turned off in response to the deactivated node Q'. Further, the voltage of the node Nb is held at the gate high voltage VGH of the period ④ due to the turn-off of the transistor T4. The transistor T5 is turned off in response to the node Nb of the gate high voltage VGH.

In the period ⑤, the node QB is floated by the turn-off of the transistor T6. However, the voltage of the node QB is held at the gate low voltage VGL of the period ④ due to the capacitor CQB. The transistor Td is turned on in response to the node QB of the gate low voltage VGL.

As a result, in the period ⑤, the emission signal EM(1) of the gate high voltage VGH is output to the node Na via the transistor Td. Namely, the emission signal EM(1) is held at the gate high voltage VGH.

Figure 9F:
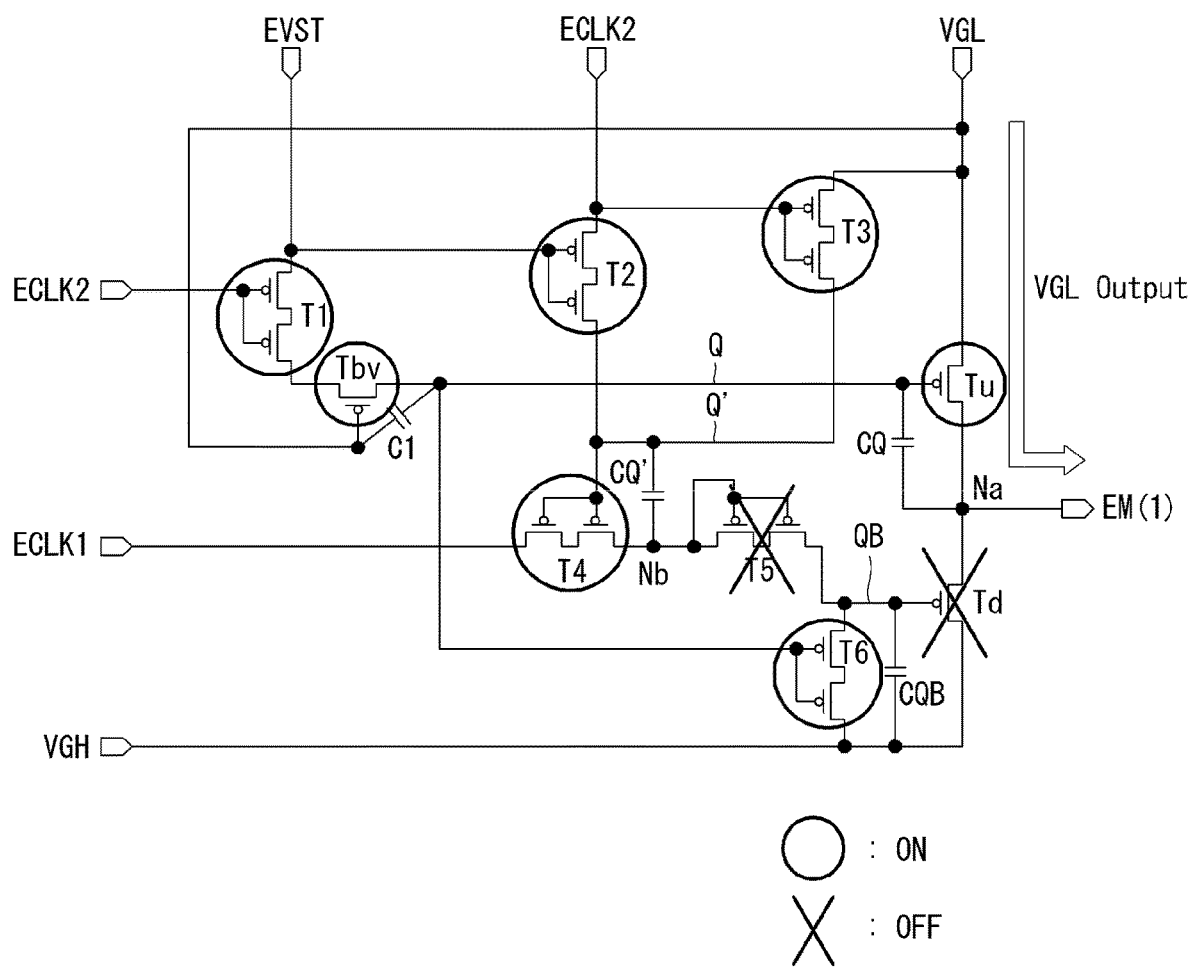

Referring to FIGS. 8 and 9F, in a period ⑥, the external start signal EVST and the second clock signal ECLK2 are input at the gate low voltage VGL, and the first clock signal ECLK1 is input at the gate high voltage VGH.

In the period ⑥, the transistor T2 is turned on in response to the external start signal EVST of the gate low voltage VGL, and the transistor T5 is turned off in response to the first clock signal ECLK1 of the gate high voltage VGH. Further, the transistors T1 and T3 are turned on in response to the second clock signal ECLK2 of the gate low voltage VGL.

In the period ⑥, the node Q is activated to the gate low voltage VGL by the external start signal EVST applied through the transistor T1. The transistors T6 and Tu are turned on in response to the activated node Q.

In the period ⑥, the node Q' is activated to the gate low voltage VGL by the second clock signal ECLK2 applied through the transistor T2 and the gate low voltage VGL applied through the transistor T3. The transistor T4 is turned on in response to the activated node Q'. The voltage of the node Nb is the gate high voltage VGH by the first clock signal ECLK1 applied through the transistor T4. The transistor T5 is turned off by the node Nb of the gate high voltage VGH.

In the period ⑥, the node QB is deactivated by the gate high voltage VGH applied through the transistor T6. The transistor Td is turned off in response to the deactivated node QB.

As a result, in the period ⑥, the emission signal EM(1) of the gate low voltage VGL is output to the node Na via the transistor Tu. Namely, the emission signal EM(1) is inverted to the gate low voltage VGL.

Figure 9G:
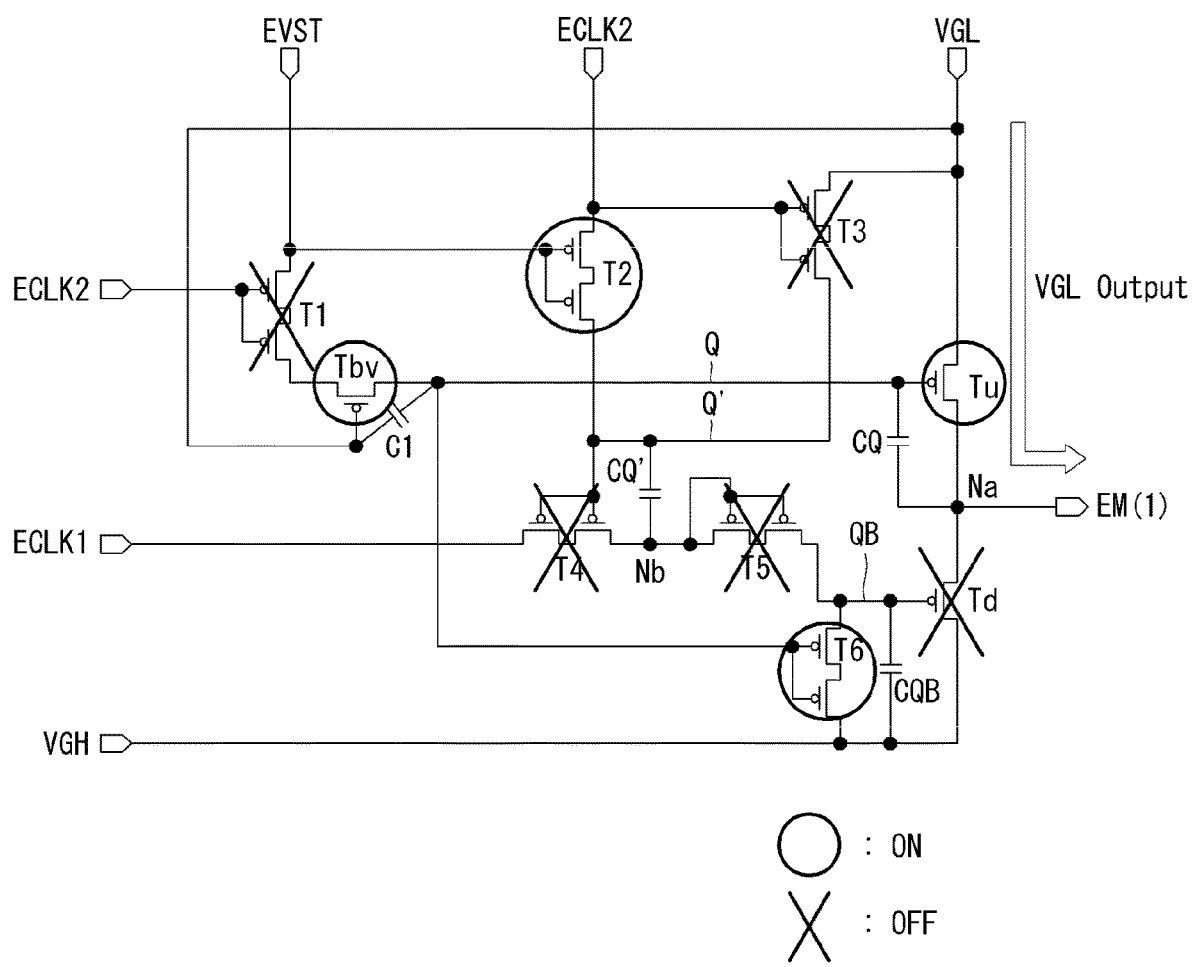

Referring to FIGS. 8 and 9G, in a period ⑦, the external start signal EVST and the first clock signal ECLK1 are input at the gate low voltage VGL, and the second clock signal ECLK2 is input at the gate high voltage VGH.

In the period ⑦, the transistor T2 is turned on in response to the external start signal EVST of the gate low voltage VGL, and the transistors T1 and T3 are turned off in response to the second clock signal ECLK2 of the gate high voltage VGH.

In the period ⑦, the node Q is floated by the turn-off of the transistor T1. Further, the node Q is held at the gate low voltage VGL of the period ⑥ and is activated. The transistors T6 and Tu are turned on in response to the activated node Q.

In the period ⑦, the node Q' is deactivated to the gate high voltage VGH by the second clock signal ECLK2 applied through the transistor T2. The transistor T4 is turned off in response to the deactivated node Q'. Further, the voltage of the node Nb is held at the gate high voltage VGH of the period ⑥ due to the turn-off of the transistor T4. The transistor T5 is turned off in response to the node Nb of the gate high voltage VGH.

In the period ⑦, the node QB is deactivated by the gate high voltage VGH applied through the transistor T6. The transistor Td is turned off in response to the deactivated node QB.

As a result, in the period ⑦, the emission signal EM(1) of the gate low voltage VGL is output to the node Na via the transistor Tu. Namely, the emission signal EM(1) is held at the gate low voltage VGL of the period ⑥.

The operation of the stage in the periods ⑤ to ⑦ is summarized in Table 2 below.

TABLE 2

| | Period ⑤ | Period ⑥ | Period ⑦ |
|---|---|---|---|
| EVST | EVST "VGL" → T2 "ON" | EVST "VGL" → T2 "ON" | EVST "VGL" → T2 "ON" |
| ECLK1 | ECLK1 "VGL" | ECLK1 "VGH" → T5 "OFF" | ECLK1 "VGL" → T5 "ON" |
| ECLK2 | ECLK2 "VGH" → T1 and T3 "OFF" | ECLK2 "VGL" → T1 and T3 "ON" | ECLK2 "VGH" → T1 and T3 "OFF" |
| Q node | Q node "VGH" hold → T6 and Tu "OFF" | Q node "VGL" → T6 and Tu "ON" | Q node "VGL" hold → T6 and Tu "ON" |
| Q' node | Q' node "VGH" → T4 and T5 "OFF" | Q' node "VGL" → T4 "ON" | Q' node "VGH" → T4 "OFF" |
| QB node | QB node "VGL" hold → Td "ON" | QB node "VGH" → Td "OFF" | QB node "VGH" hold → Td "OFF" |
| EM Output | EM(1) "VGH" hold | EM(1) "VGL" | EM(1) "VGL" hold |

As shown in FIG. 8, the stage repeatedly performs the operation of the period ⑥ and the operation of the period ⑦ for a remaining time excluding the periods ① to ⑦ from one frame period.

As described above, the embodiments of the disclosure can greatly increase the reliability of the display device by securing the operation stability of the emission driver.

Although the embodiments have been described with reference to a number of illustrative embodiments thereof, numerous other modifications and embodiments can be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A gate driver comprising:
a plurality of stages,
wherein each of the plurality of stages includes:
a transistor T1 configured to apply a start signal to a node Q;
a transistor Tu configured to output an emission signal of a gate low voltage to a node Na depending on a voltage of the node Q;
a transistor T5 configured to control a voltage of a node QB to be reversed to the voltage of the node Q;
a transistor Td configured to output the emission signal of a gate high voltage higher than the gate low voltage to the node Na depending on the voltage of the node QB;
a transistor Tbv connected between the transistor T1 and the node Q and configured to stabilize the voltage of the node Q;
a transistor T2 configured to apply a clock signal ECLK2 to a node Q' in response to the start signal;
a transistor T3 configured to apply the gate low voltage to the node Q' in response to the clock signal ECLK2,
a capacitor CQ' connected between the node Q' and a node Nb and configured to bootstrap a voltage of the node Q' to a voltage level lower than the gate low voltage in response to a clock signal ECLK1 which is out of phase with the clock signal ECLK2; and
a transistor T4 configured to apply the clock signal ECLK1 to the node Nb depending on the voltage of the node Q',
wherein the transistor T5 includes a gate electrode and a first electrode that are connected to the node Nb, and a second electrode connected to the node QB.

2. The gate driver of claim 1, further comprising a capacitor C1 provided between a gate electrode of the transistor Tbv and the node Q and configured to stabilize the voltage of the node Q,
wherein the gate low voltage is applied to the gate electrode of the transistor Tbv.

3. The gate driver of claim 1, wherein a gate electrode of the transistor T2 is directly connected to an input terminal of the start signal.

4. The gate driver of claim 3, wherein for a certain period of time from a time at which the emission signal is inverted from the gate high voltage to the gate low voltage,
the voltage of the node Q is held at the gate low voltage capable of turning on the transistor Tu, the voltage of the node QB is held at the gate high voltage capable of turning off the transistor Td, and
the voltage of the node Q' swings between the gate low voltage and the gate high voltage in synchronization with the clock signal ECLK2.

5. The gate driver of claim 1, wherein a gate electrode of the transistor Tu is connected to the node Q, a first electrode of the transistor Tu is connected to the node Na, and a second electrode of the transistor Tu is connected to an input terminal of the gate low voltage, and
wherein a gate electrode of the transistor Td is connected to the node QB, a first electrode of the transistor Td is connected to an input terminal of the gate high voltage, and a second electrode of the transistor Td is connected to the node Na.

6. The gate driver of claim 5, further comprising a capacitor CQ connected between the node Q and the node Na.

7. The gate driver of claim 5, further comprising a capacitor CQB connected between the node QB and the input terminal of the gate high voltage.

8. A gate driver comprising:
a plurality of stages,
wherein each of the plurality of stages includes:
a transistor Tu connected between an input terminal of a gate low voltage and a node Na and configured to output an emission signal of the gate low voltage depending on a voltage of a node Q;
a transistor Td connected between an input terminal of a gate high voltage and the node Na and configured to output the emission signal of the gate high voltage depending on a voltage of a node QB; and
a node controller configured to control the voltage of the node Q, the voltage of the node QB, and a voltage of a node Q' between the input terminal of the gate low voltage and the node QB based on a start signal of which a phase is earlier than a phase of the emission signal, and a first clock signal and a second clock signal,
wherein for a certain period of time from a time at which the emission signal is inverted from the gate high voltage to the gate low voltage, the voltage of the node Q is held at the gate low voltage capable of turning on the transistor Tu, and
wherein the node controller includes:
a transistor T2 configured to apply the second clock signal to the node Q' in response to the start signal;
a transistor T3 configured to apply the gate low voltage to the node Q' in response to the second clock signal;
a capacitor CQ' connected between the node Q' and a node Nb and configured to bootstrap the voltage of the node Q' to a voltage level lower than the gate low voltage in response to the first clock signal;
a transistor T4 configured to apply the first clock signal to the node Nb depending on the voltage of the node Q'; and
a transistor T5 including a gate electrode and a first electrode that are connected to the node Nb, and a second electrode connected to the node QB.

9. The gate driver of claim 8, wherein for the certain period of time, the voltage of the node QB is held at the gate high voltage capable of turning off the transistor Td, and the voltage of the node Q' swings between the gate low voltage and the gate high voltage in synchronization with the second clock signal.

10. The gate driver of claim 8, wherein the node controller includes:

a transistor T1 configured to apply the start signal to the node Q; and a transistor Tbv connected between the transistor T1 and the node Q and configured to stabilize the voltage of the node Q to the gate low voltage for the certain period of time.

11. The gate driver of claim 10, further comprising a capacitor C1 provided between a gate electrode of the transistor Tbv and the node Q and configured to stabilize the voltage of the node Q, wherein the gate low voltage is applied to the gate electrode of the transistor Tbv.

12. The gate driver of claim 8, wherein a gate electrode of the transistor T2 is directly connected to an input terminal of the start signal.

13. The gate driver of claim 8, wherein the node controller includes a capacitor CQ connected between the node Q and the node Na.

14. The gate driver of claim 8, wherein the node controller includes a capacitor CQB connected between the node QB and the input terminal of the gate high voltage.

15. A display device comprising:

a display panel including a plurality of gate lines connected to a plurality of pixels; and the gate driver configured to drive the gate lines using outputs of the stages according to claim 1.

16. The display device of claim 15, wherein each of the plurality of pixels includes:

an organic light emitting diode;

a driving thin film transistor configured to control a driving current flowing in the organic light emitting diode depending on a gate-to-source voltage; and an emission thin film transistor turned on or off in response to an emission signal and configured to determine an emission time of the organic light emitting diode.

17. A display device comprising:

a display panel including a plurality of gate lines connected to a plurality of pixels; and the gate driver configured to drive the gate lines using outputs of the stages according to claim 8.

18. The display device of claim 17, wherein each of the plurality of pixels includes:

an organic light emitting diode;

a driving thin film transistor configured to control a driving current flowing in the organic light emitting diode depending on a gate-to-source voltage; and an emission thin film transistor turned on or off in response to an emission signal and configured to determine an emission time of the organic light emitting diode.

* * * * *